US011422182B2

(12) United States Patent
Liu et al.

(10) Patent No.: US 11,422,182 B2
(45) Date of Patent: Aug. 23, 2022

(54) SYSTEMS AND METHODS FOR FAULT DETECTION AND REPORTING THROUGH SERIAL INTERFACE TRANSCEIVERS

(71) Applicant: Maxim Integrated Products, Inc., San Jose, CA (US)

(72) Inventors: Ling Liu, Sunnyvale, CA (US); Robert Gee, Sunnyvale, CA (US)

(73) Assignee: Maxim Integrated Products, Inc., San Jose, CA (US)

( * ) Notice: Subject to any disclaimer, the term of this patent is extended or adjusted under 35 U.S.C. 154(b) by 35 days.

(21) Appl. No.: 17/150,148

(22) Filed: Jan. 15, 2021

(65) Prior Publication Data

US 2021/0302488 A1 Sep. 30, 2021

Related U.S. Application Data

(60) Provisional application No. 63/001,392, filed on Mar. 29, 2020.

(51) Int. Cl.
*G01R 31/28* (2006.01)
*G01R 31/317* (2006.01)

(52) U.S. Cl.
CPC ..... *G01R 31/2836* (2013.01); *G01R 31/2879* (2013.01); *G01R 31/31701* (2013.01); *G01R 31/31727* (2013.01)

(58) Field of Classification Search
CPC .............. G01R 31/002; G01R 31/2805; G01R 31/2889; G01R 31/3181; G01R 31/31816; G01R 31/3193; G01R 31/31937
See application file for complete search history.

(56) References Cited

U.S. PATENT DOCUMENTS 9,568,533 B2 2/2017 Jiang et al.
10,310,934 B2 6/2019 Du et al.
(Continued)

FOREIGN PATENT DOCUMENTS

WO 2013082914 A1 6/2013

OTHER PUBLICATIONS

MAXIM Integrated, 3054/Max3055/MAX3056 Datasheet, "±80V Fault-Protected/Tolerance Can Transeiver", Maxim Integrated, available from the internet, <URL:https://www.datasheetspdf.com/datasheet/MAX3056.html>, (5pgs).

(Continued)

*Primary Examiner* — Tung X Nguyen
(74) *Attorney, Agent, or Firm* — North Weber & Baugh LLP; Michael North

(57) ABSTRACT

Circuitry, systems, and methods for fault detection and reporting comprise a fault detection circuit configured to detect one or more fault conditions that cause a state change in a fault pin voltage representative of a transceiver failure. Once the state of the fault pin voltage changes, a transceiver input generates a fault detection code. In embodiments, in response to the transceiver input receiving a first signal, the fault detection code is shifted to a transceiver output that may communicate the fault detection code to a controller. Once the transceiver input receives a second signal, the fault pin voltage may be reset to clear the fault detection code before resuming operations, including detecting additional fault conditions as they arise.

20 Claims, 11 Drawing Sheets

(56) References Cited

U.S. PATENT DOCUMENTS

| | | |
|---|---|---|
| 2004/0158781 A1 | 8/2004 | Pihet |
| 2020/0049754 A1 | 2/2020 | Hubbard et al. |
| 2020/0233832 A1* | 7/2020 | Jamadagni .......... G06F 13/4217 |
| 2021/0334152 A1* | 10/2021 | Hayase ............... G06F 11/1604 |

OTHER PUBLICATIONS

MAXIM Integrated, "MAXIM 3097, ±15kV ESD-Protected, 32Mbps, 3V/5V, Triple RS-422/RS-485 Receivers with Fault Detection", Rev Jul. 2000. Available from the Internet, <URL:https://www.datasheetq.com/datasheet-download/478484/1/MaximIC/MAX3097>, (16 pgs).

MAXIM Integrated, "Max 3097E/MAX3098E, ±15kV ESD-Protected, 32Mbps, 3V/5V, Triple RS-422/RS-485 Receivers with Fault Detection", Rev May 2019. Available from the Internet, <URL:https://datasheets.maximintegrated.com/en/ds/MAX3097E-MAX3098E.pdf>, (13 pgs). Apr. 2014.

MAXIM Integrated, "MAX3440E-MAX3444E Datasheet, ±15kV ESD-Protected, ±60V Fault-Protected, 10Mbps, Fail-Safe RS-485/J1708 Transceivers". Available from the Internet, <URL:https://datasheets.maximintegrated.com/en/ds/MAX3440E-MAX3444E.pdf>, (5 pgs).

MAXIM Integrated, "MAX3441E, ±15kV ESD-Protected, ±60V Fault-Protected 10Mbps, Fail-Safe RS-482/J1708 Transceivers", Rev Apr. 2014. Available from the Internet, <URL:https://datasheets.maximintegrated.com/en/ds/MAX3440E-MAX3444E.pdf>, (5 pgs).

MAXIM Integrated, "MAX14890E, Incremental Encoder Interface for RS-422, HTL, and TTL with Digital Inputs", Rev Mar. 2015. Available from the Internet, <URL:https://datasheetspdf.com/pdf/924984/Maxim/MAX14890E/1>, (5 pgs).

MAXIM Integrated, "MAX14891E, Quad Fault-Protected RS-485/RS-422 Receiver with Fault Detection", Rev Mar. 2015. Available from the Internet, <URL:https://datasheets.maximintegrated.com/en/ds/MAX14891E.pdf>, (12 pgs).

\* cited by examiner

600

SYSTEMS AND METHODS FOR FAULT DETECTION AND REPORTING THROUGH SERIAL INTERFACE TRANSCEIVERS

CROSS REFERENCE TO RELATED PATENT APPLICATIONS

This application is related to and claims the priority benefit, under 35 U.S.C. § 119(e), from U.S. Provisional Patent Application, Ser. No. 63/001,392 entitled "Systems and Methods for Fault Detection and Reporting Through Serial Interface Transceivers," filed on Mar. 29, 2020 and listing as inventors Ling Liu and Robert Gee. Each reference mentioned in this patent document is incorporated by reference herein in its entirety and for all purposes.

BACKGROUND

A. Technical Field

The present disclosure relates generally to systems and methods for improved troubleshooting in electric circuits. More particularly, the present disclosure relates to systems and methods for detecting, diagnosing, and reporting faults in circuits that comprise serial interface transceiver circuits.

B. Background

Some serial transceivers employ fault detection circuits that utilize a dedicated fault pin to indicate the presence of a fault to a local microcontroller, e.g., in the form of an interrupt. However, there are no known designs that are capable of generating an error code and reporting an appropriate fault massage to clearly identify which of a number of types of fault that has occurred, leaving much of troubleshooting to guesswork. As a result, technicians have to spend considerable amount of time figuring out what kind of problem is present each time existing fault detection circuits flag an error. In addition to not knowing the nature of the fault, a technician has no easy way of knowing the exact location where the fault occurred, e.g., the precise node location within a given network.

Accordingly, what is needed are intelligent systems and methods that enable more efficient troubleshooting, thereby, reducing equipment down time, maintenance costs, etc.

BRIEF DESCRIPTION OF THE DRAWINGS

References will be made to embodiments of the invention, examples of which may be illustrated in the accompanying figures. These figures are intended to be illustrative, not limiting. Although the invention is generally described in the context of these embodiments, it should be understood that it is not intended to limit the scope of the invention to these particular embodiments. Items in the figures are not to scale.

DETAILED DESCRIPTION OF EMBODIMENTS

Figure 1:
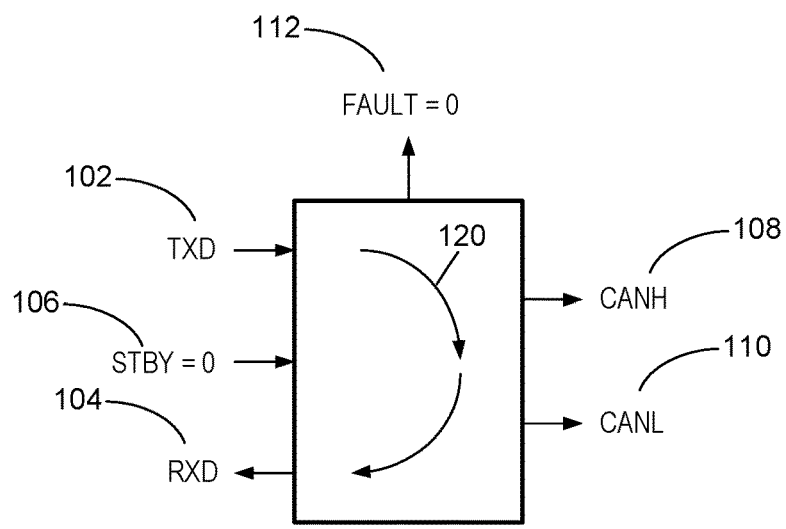
FIG. 1 illustrates an exemplary transceiver in a regular transceiver mode according to various embodiments of the present disclosure.

In the following description, for purposes of explanation, specific details are set forth in order to provide an understanding of the invention. It will be apparent, however, to one skilled in the art that the invention can be practiced without these details. Furthermore, one skilled in the art will recognize that embodiments of the present invention, described below, may be implemented in a variety of ways, such as a process, an apparatus, a system, a device, or a method on a tangible computer-readable medium.

Components, or modules, shown in diagrams are illustrative of exemplary embodiments of the invention and are meant to avoid obscuring the invention. It shall also be understood that throughout this discussion that components may be described as separate functional units, which may comprise sub-units, but those skilled in the art will recognize that various components, or portions thereof, may be divided into separate components or may be integrated together, including integrated within a single system or component. It should be noted that functions or operations discussed herein may be implemented as components. Components may be implemented in software, hardware, or a combination thereof.

Furthermore, connections between components or systems within the figures are not intended to be limited to direct connections. Rather, data between these components may be modified, re-formatted, or otherwise changed by intermediary components. Also, additional or fewer connections may be used. It shall also be noted that the terms "coupled," "connected," or "communicatively coupled" shall be understood to include direct connections, indirect connections through one or more intermediary devices, and wireless connections.

Reference in the specification to "one embodiment," "preferred embodiment," "an embodiment," or "embodiments" means that a particular feature, structure, characteristic, or function described in connection with the embodiment is included in at least one embodiment of the invention and may be in more than one embodiment. Also, the appearances of the above-noted phrases in various places in the specification are not necessarily all referring to the same embodiment or embodiments.

The use of certain terms in various places in the specification is for illustration and should not be construed as limiting. A service, function, or resource is not limited to a single service, function, or resource; usage of these terms may refer to a grouping of related services, functions, or resources, which may be distributed or aggregated.

The terms "include," "including," "comprise," and "comprising" shall be understood to be open terms and any lists the follow are examples and not meant to be limited to the listed items. Any headings used herein are for organizational purposes only and shall not be used to limit the scope of the description or the claims. Each reference mentioned in this patent document is incorporate by reference herein in its entirety.

Further, it is noted that embodiments described herein are given in the context of CAN and RS-485 transceivers, but one skilled in the art shall recognize that the teachings of the present disclosure are not so limited and may equally be used in applications other than those involving serial interface transceivers. Furthermore, it is understood that while presented single-pin embodiments have certain advantages over more complex designs, such as $I^2C$ design that require two pins or SPIs that require three or four pins, the teachings of present disclosure are not limited to any specific design.

In this document the terms "transmission failure" and "open circuit failure" are used interchangeably. Similarly, the terms "block," "module," and "circuit" are used interchangeably. "Transceiver" comprises any transceivers recognized by one of skilled in the art. The term "transceiver mode" and "active normal transceiver mode" refer to a regular mode of operation, i.e., a transmission state without any fault or error.

FIG. 1 illustrates an exemplary transceiver operating in a regular transceiver mode, according to various embodiments of the present disclosure. Transceiver 100 comprises input pin 102 (labeled TXD), output pin 104 (labeled RXD), standby pin 106, and output data lines 108, 110 (labeled CANH and CANL, respectively).

In operation, when transceiver 100 is in a regular mode of operation, no fault disturbance is present, as indicated by standby pin 106 and fault pin 112 having a low voltage (or '0') signal. Data received at input 102 is driven through output data lines 108, 110, which, in effect, convert the single-ended data line at input 102 into a differential signal for output data lines 108, 110. In transceiver mode, data received at output pin 104 is essentially the same data as that received on input pin 102 that is transmitted through output data lines 108, 110, thereby, closing the regular TXD to RXD loop 120. Output 104 may be coupled to a controller (not shown in FIG. 1), e.g., a microcontroller that is capable of reading the data. A person of skill in the art will appreciate that data received at output data lines 108, 110 may be communicated to one or more other transceivers (also not shown in FIG. 1) that each may represent a node in a communication network.

Figure 2:
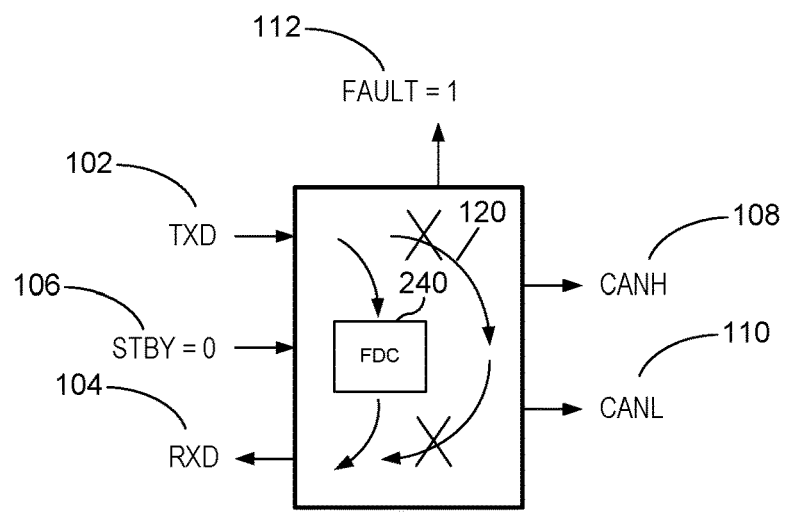
FIG. 2 illustrates an exemplary transceiver comprising an exemplary fault reporting block according to various embodiments of the present disclosure.

FIG. 2 illustrates an exemplary transceiver comprising an exemplary fault reporting block according to various embodiments of the present disclosure. In a manner similar to the transceiver in FIG. 1, transceiver 200 comprises input pin 102, output pin 104, fault pin 112, output data lines 108, 110, and standby pin 106. As depicted in FIG. 2, transceiver 200 further comprises fault reporting block 240 that, in embodiments, depending on the present of data at input 102 and output 104, may enable fault detection, collect and clear fault detection codes (FDCs), and perform other fault-detection-related tasks. As discussed in greater detail below with reference to FIG. 3, in embodiments, fault detection in a fault detection circuit may be enabled, e.g., after a number of rising edge pulses have been transmitted to input pin 102. In embodiments, in response to the detection circuit detecting one or more fault conditions on data line CANH 108 and/or CANL 110, fault pin 112 may change its state, e.g., go from low to high, thereby, breaking regular transmission loop 120, such that the driver to output data lines 108, 110 may be turned off.

It is noted that fault pin 112 need not flag its state change immediately after detecting a fault condition. Instead, in embodiments, circuit 100 may first wait, e.g., for a predetermined waiting period, to ensure that the detected condition is not intermittent. A suitable waiting period may be facilitated by counting clock cycles using a state machine, a counter, or any other means known in the art. As discussed in greater detail with reference to FIG. 3, fault reporting block 240 may further comprise circuitry for assigning priorities to fault errors, e.g., in order to prioritize which fault error(s) should be treated as more critical than others, such that the fault error with the highest priority be may be reported (or reported first).

In embodiments, once fault pin 112 has been flagged, e.g., after a settling time that may comprise waiting for input 102 to receive a number of pulses and output data lines 108, 110 have been turned off, e.g., by assuming a high impedance state, the FDC may be shifted through one or more registers and output from output pin 104. The FDC may be further processed by a local microcontroller, for example, to generate an error message or an alert, thus, utilizing the FDC to correctly identify and report an error type and/or location.

In embodiments, the state change at fault pin 112 may trigger an interrupt associated with the microcontroller and also cause a driver (not shown in FIG. 2) to disable output data lines 108, 110 and/or receiver output 104. In embodiments, in response to fault pin 112 being flagged, input pin 102 may operate as an edge-triggered clock that aids in shifting the FDC to output pin 104, e.g., via a register(s) for storing the FDC.

It is understood that while FDC data are mainly described as being shifted out onto output pin 104, in embodiments, fault pin 112 may equally serve as a path for FDC data, in effect, serving as a dual function pin. Similarly, other pins such as standby pin 106, may serve more than one purpose, for example, by using a slow slew rate to control different modes.

Figure 3:
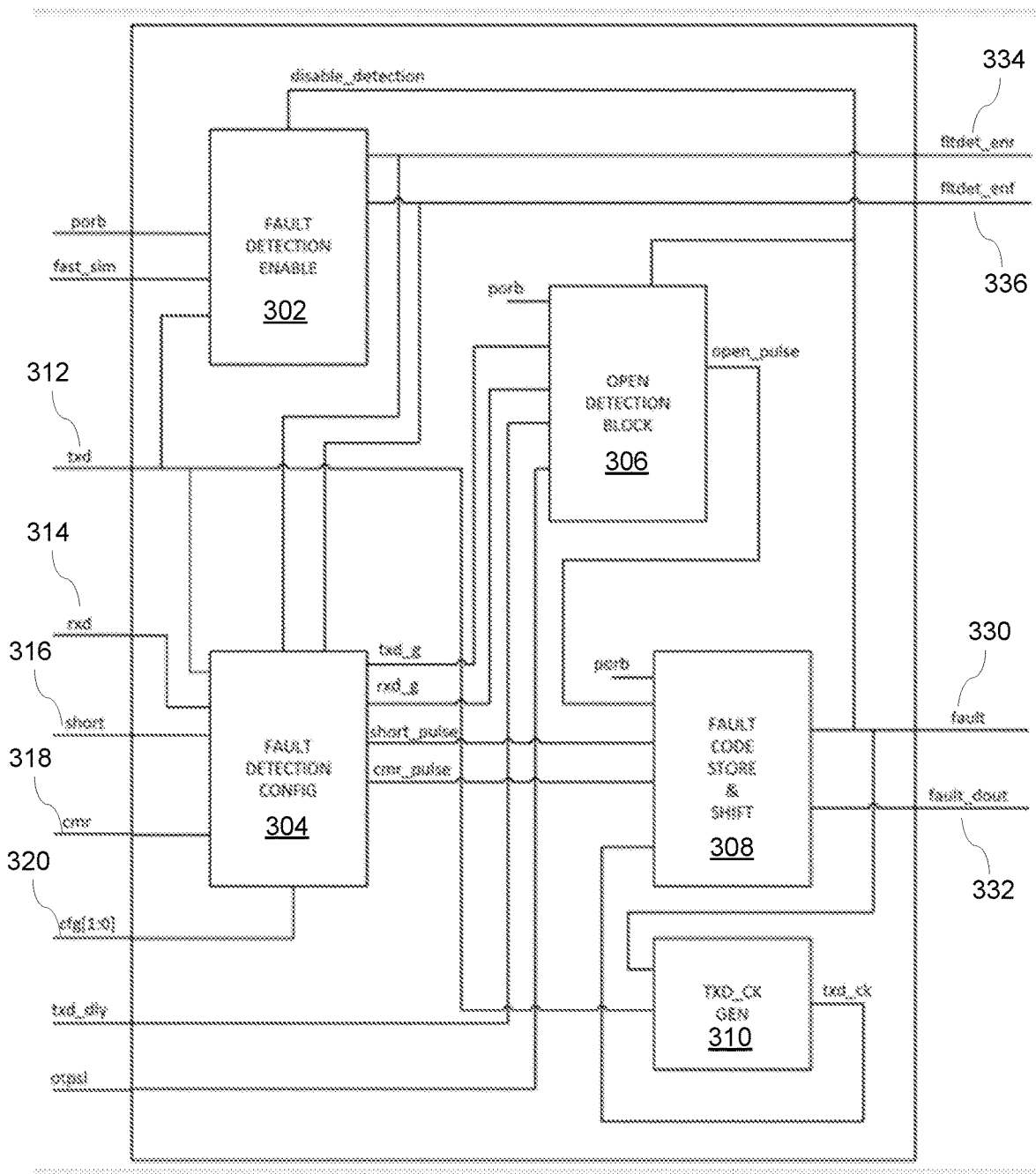
FIG. 3 is an exemplary fault reporting block diagram according to various embodiments of the present disclosure.

FIG. 3 is an exemplary fault reporting block diagram according to various embodiments of the present disclosure. Fault reporting block 300 comprises fault detection enable module 302, fault detection configuration module 304, open detection block 306, fault code store and shift module 308, and transceiver clock generation module 310. As indicated in FIG. 3, fault reporting block diagram 300 comprises numerous inputs and outputs, such as input 312 (labeled 'txd'), which may receive the input signal 102 in FIG. 1, input 314 labeled 'rxd,' which may output the output signal 104 in FIG. 1. Input 316 may receive, e.g., an output signal from a short detection circuit. Input 318 may receive an output signal, e.g., from a common mode range detection circuit.

In embodiments, input 320 may handle a signal from a configuration register from which, for example, one or more FDCs may be selected for reporting. Output 330 may output a fault signal to reset voltage at a fault pin, such as pin 112 in FIG. 1, and output 332 may go to a receiver output 104, on which, as mentioned previously, an FDC may be shifted out.

In embodiments, enable module 302 may generate one or more pulses that determine when fault detection is enabled. Outputs 334 and 336 in fault reporting block 300 denote a signal that triggers on respective rising and/or falling edges. In embodiments, open detection block 306 may be used, e.g., to infer an open circuit condition from the fact that a signal is present at input 312 but no signal is present at input 314.

In embodiments, fault reporting block 300 may be used to implement a priority scheme comprising an order of priority that indicates when a detected short circuit condition should receive a higher priority than an open circuit condition, which, in turn, receives a higher priority than a detected (CMR) over range detection failure. Once an order of priority has been established, fault reporting block 300 may, in response to a fault condition being detected, wait for and/or consider one or more additional fault conditions to select a fault condition that, according to the priority scheme, has a higher priority, before using fault signal 330 to flag a fault pin and determining a suitable FDC associated with the fault condition.

In embodiments, once an error has been detected and an FDC is reported, fault signal 330 may be used to reset a fault pin voltage. In embodiments, fault signal 330 may be cleared by counting a number of pulses (e.g., 10 rising edge pulses) of input signal 312 that may be driven by a microcontroller. It is noted that counting or waiting for a number of pulses to pass may accommodate a circuit settling time to, advantageously, to increase the number of correctly detected faults in a circuit.

It is understood that, in embodiments, resetting or clearing an FDC may comprise a manual reset that may be performed, e.g., by a technician. In embodiments, transceiver clock generation module 310 may use input 312 as an internal clock, without relying on an oscillator or a 'real' clock in the ordinary sense to enable the dual function of input 312.

Figure 4:
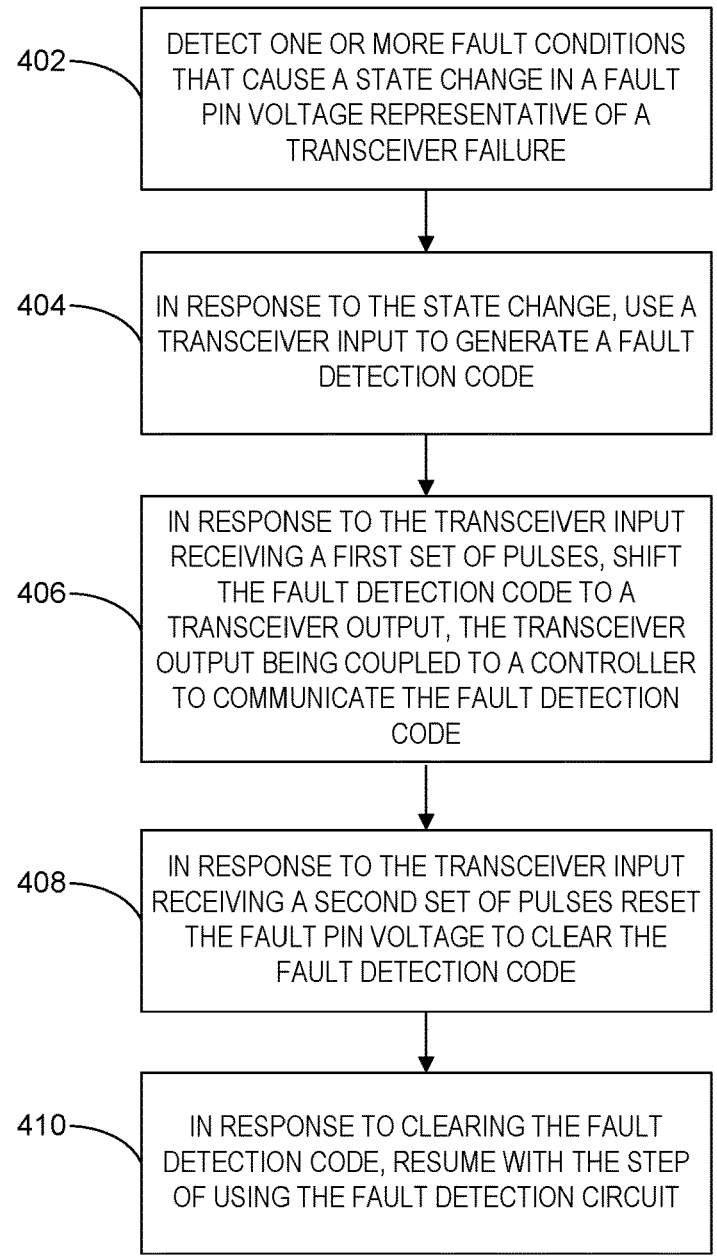
FIG. 4 is a flowchart illustrating a process for using an exemplary fault detection and reporting circuit according to various embodiments of the present disclosure.

FIG. 4 is a flowchart that illustrates an iterative process for using a fault detection and reporting circuit according to various embodiments of the present disclosure. In embodiments, process 400 may start, at step 402, when one or more fault conditions, which cause a state change in a fault pin voltage, are detected, e.g., in response to using a series of pulses received at transceiver input to start a fault detection cycle. The state change may represent one of a number of possible transceiver failures. In embodiments, the one or more fault conditions may be detected at one or more output data lines, for example, according to a priority order that distinguishes between short, open, and CMR conditions.

At step 404, in response to the state change, the transceiver input is used to generate a fault detection code associated with the fault condition.

At step 406, in response to the transceiver input receiving one or more signals, the fault detection code may be shifted out of a transceiver output and may be communicated to a controller, e.g., a microcontroller that is coupled to the output of the transceiver. In some examples is the fault detection code shifted out to one or more transceivers.

At step 408, in response to the transceiver input receiving a second set of signals, the fault pin voltage may be reset, for example, to clear the fault detection code.

Finally, at step 410, in response to clearing the fault detection code, process 400 may resume with the step of using the fault detection circuit.

One skilled in the art shall recognize that: (1) certain steps may optionally be performed; (2) steps may not be limited to the specific order set forth herein; (3) certain steps may be performed in different orders; and (4) certain steps may be done concurrently.

Figure 5:
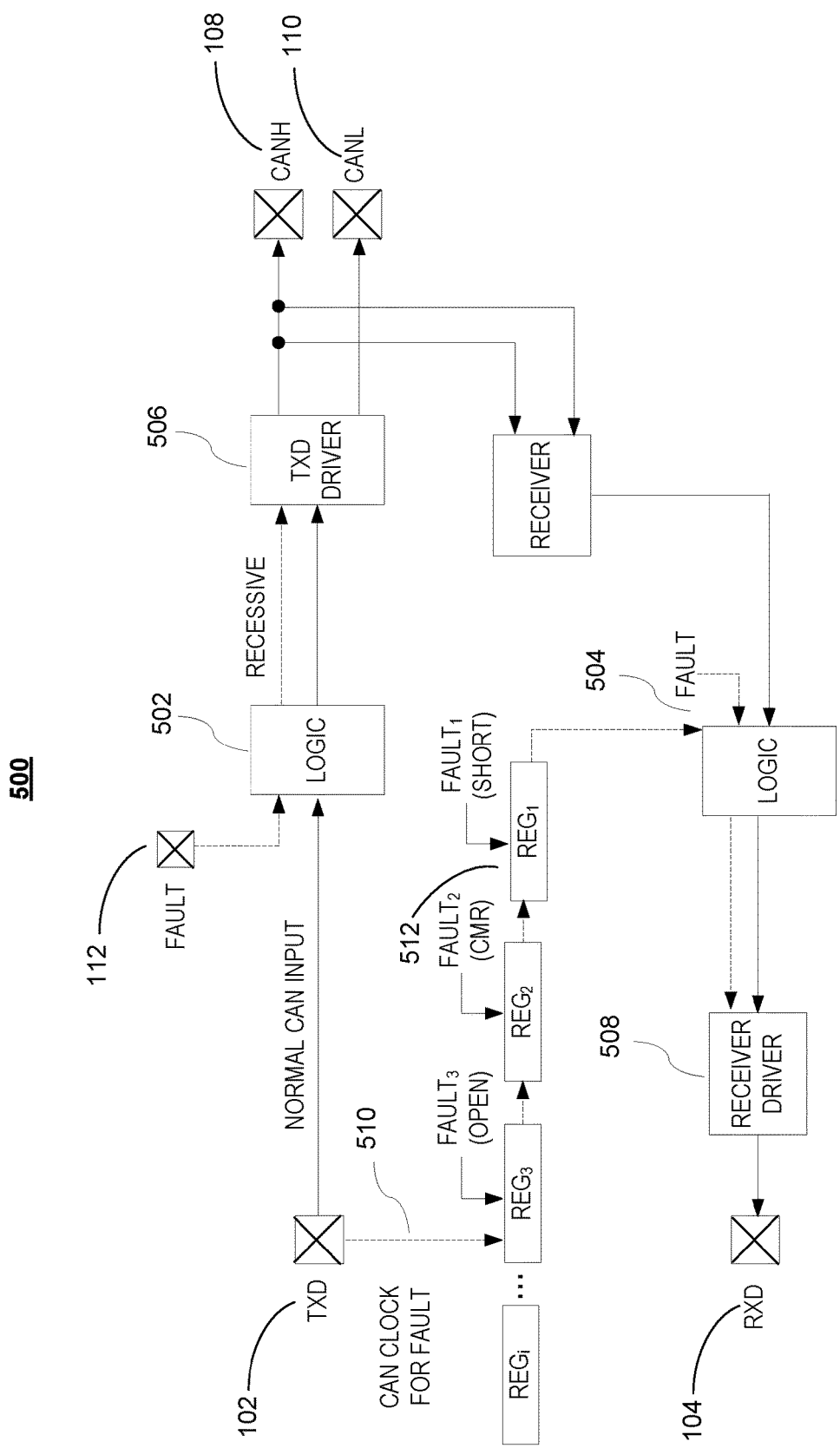
FIG. 5 illustrates an exemplary fault path for a transceiver circuit operating in a fault mode according to embodiments of the present disclosure.

FIG. 5 illustrates an exemplary fault path for a transceiver circuit operating in a fault mode, according to embodiments of the present disclosure. Same numerals as in FIG. 1 denote similar elements. Circuit 500 comprises logic levels 502, 504, receiver driver 508, fault path 510, and registers (e.g., 512). In embodiments, depending on a fault state, output 104 may output regular data (e.g., in an active normal transceiver mode) or FDCs (e.g., in a fault mode).

In operation, input 102 may receive a CAN input signal and, absent any errors, voltage on fault pin 112 remains 'low.' In embodiments, in response to a fault being detected, i.e., the voltage on fault pin 112 goes 'high' and, according to conventional CAN transceiver logic, circuit 500 enters into fault mode, in which output data lines 108, 110 are disabled or OFF.

As depicted in FIG. 5, in fault mode, dashed fault path 510 is enabled, and a clock signal may be fed to input 102 to shift out fault bits from registers (e.g., 512), via logic level 504, to receiver driver 508 and output 104. It is noted that in dominant mode, output data line 108 is high, and output data line 110 is low, resulting in a differential voltage or '1.'

As with any other figure described herein, circuit 500 is not limited to the constructional detail shown in FIG. 5 or described in the accompanying text. As those skilled in the art will appreciate, a suitable circuit may comprise numerous additional and different elements.

Figure 6:
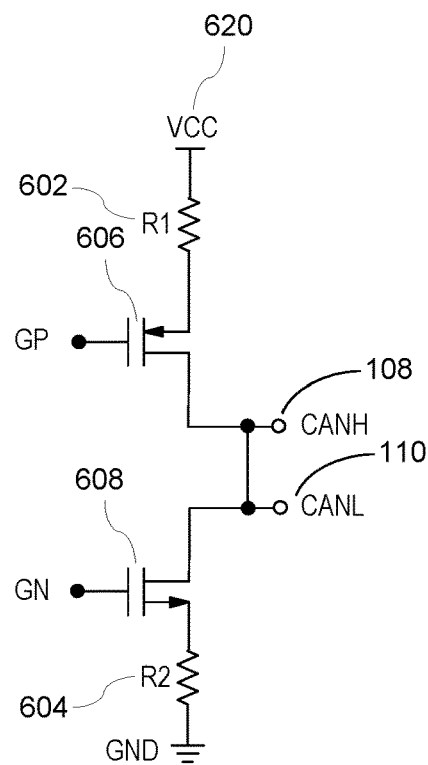
FIG. 6 illustrates an exemplary analog implementation of an overcurrent (short circuit condition) detection circuit according to various embodiments of the present disclosure.

FIG. 6 illustrates an exemplary analog implementation of an overcurrent (short circuit condition) detection circuit according to various embodiments of the present disclosure. Analog circuit 600, which may be coupled to a bus, comprises current-limiting resistors 602, 604, switches 606, 608, power supply 620, and output data lines 108, 110.

In regular operation, i.e., in a dominant state when data is being transmitted to the transceiver input and no fault is present in circuit 600, there exists a non-zero impedance, e.g., 60 Ohm, between output data lines 108 and 110, which limits current flow from power supply 620 to ground on the bus to, e.g., 60 mA. When a fault is present due to some undesirable short circuit condition, the impedance between output data lines 108 and 110 drops to about zero, such that the current from power supply 620 to ground, flowing through resistors 602, 604, will exceed 100 mA. In embodiments, when circuit 600 is in dominant mode, this current may be monitored, e.g., as voltage drop at resistor 602 and resistor 604, and may be used to trigger a short circuit fault detection.

It is noted that in fault mode, switches 606, 608 are off, thus, creating a high impedance (i.e., open circuit) condition between output data lines 108, 110, such that practically no current flows between output data lines 108, 110, which assume a common mode voltage.

Figure 7:
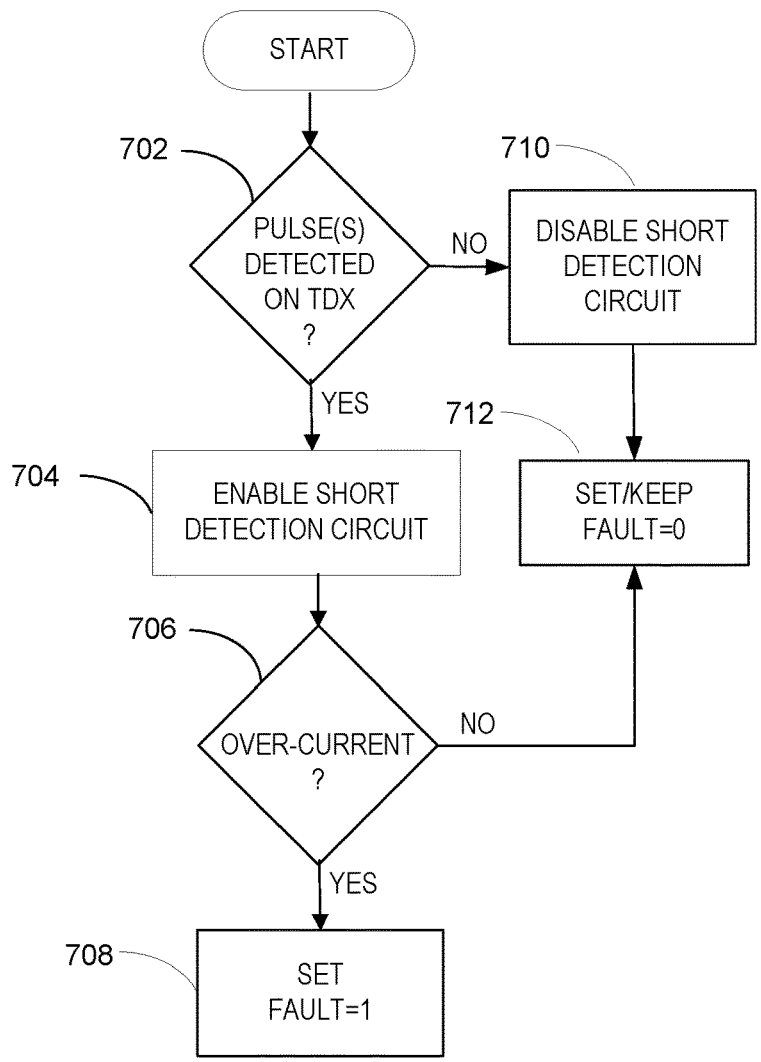
FIG. 7 is a flowchart that illustrates an exemplary process for enabling a short detection circuit according to various embodiments of the present disclosure.

In embodiments, a pulse detector (not shown) may be used to ensure that circuit 600 is, in fact, in dominant mode. FIG. 7 shows a flowchart that illustrates an exemplary process for enabling a short detection circuit according to various embodiments of the present disclosure. In embodiments, once the pulse detector detects (702) a number of pulses that may be received from a transceiver input, the pulse detector may enable (704) the short detection circuit, such that when an overcurrent condition is detected (706) the voltage on a fault pin may set to high (708), indicating the presence of a fault. Conversely, when no overcurrent condition is detected, the voltage on the fault pin may be set or allow to remain normal (712), indicating the absence of a fault.

In embodiments, if the pulse detector fails to detect a predetermined number of pulses (e.g., 100 pulses), the short detection circuit is not enabled or disabled (710).

Figure 8:
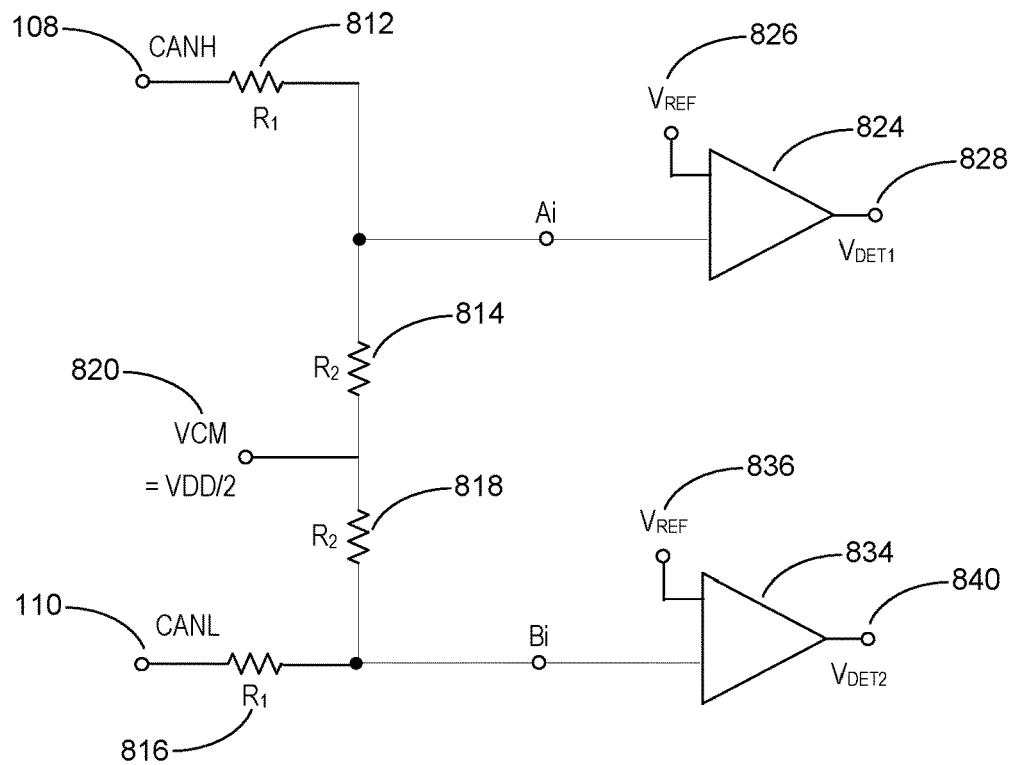
FIG. 8 illustrates an exemplary over range common mode voltage (CMR) detection circuit according to various embodiments of the present disclosure.

FIG. 8 illustrates an exemplary over range common mode voltage (CMR) detection circuit according to various embodiments of the present disclosure. As depicted, circuit 800 may comprise data lines 108, 110 resistors 812-818, VCM input 820, and comparators 826, 834 using respective voltages 826, 836, e.g., internal reference voltages. As depicted, the data line common mode voltage (labeled VCM) may be internally divided by using resistors 812-818 that may voltage divide the common mode voltage, e.g., to VDD/2, at input 820.

In operation, comparators 826, 834 may detect whether respective voltages at nodes 822, 832 fall outside of a predetermined common mode range, for example, +/−25V. In embodiments, CMR detection may be continuous, and output voltage signals 828, 838, may be stored (e.g., as a 3-bit digital code) in registers of a detection block (not shown) for fault readback.

A person of skill in the art will appreciate that in order to avoid faulty or premature triggering of a CMR fault, in embodiments, safety margins may be built into the ranges. For example, for the depicted range of +/−25V, a suitable margin may be +/−3V, which may be implemented by choosing appropriate internal references 826, 836.

Figure 9:
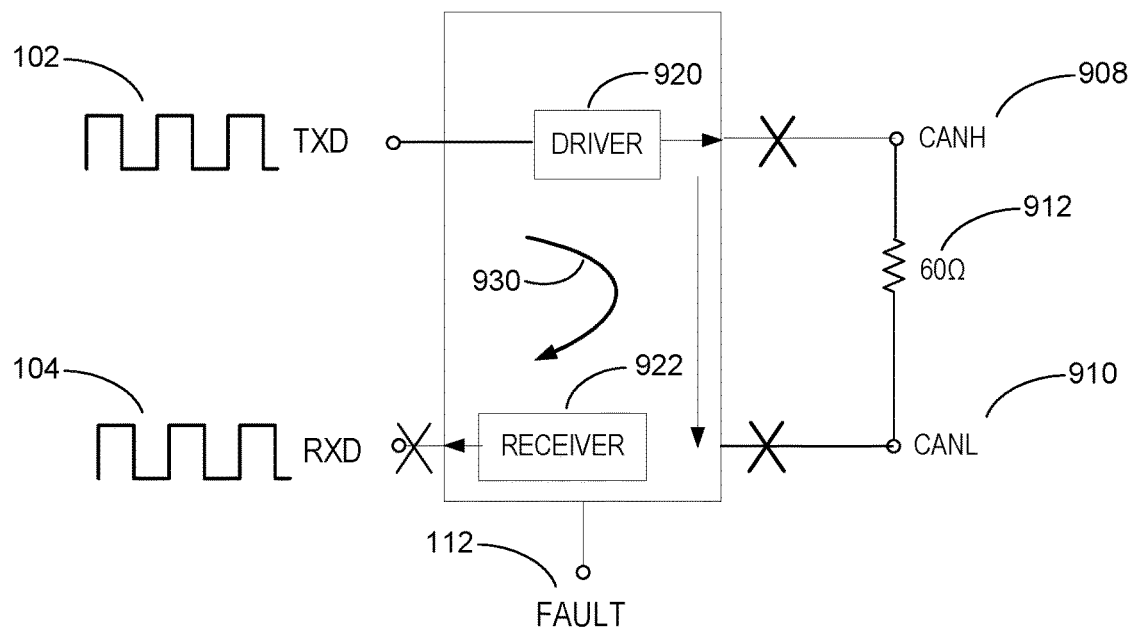
FIG. 9 illustrates an exemplary transmission failure detection circuit according to various embodiments of the present disclosure.

FIG. 9 illustrates an exemplary transmission failure detection circuit according to various embodiments of the present disclosure. Circuit 900 is a depicted as a circuit comprising input 102, output 104, output data lines 908, 910, resistor 912, fault input 912, driver 920, and receiver 922. In some examples, circuit 900 may comprise digital circuit components.

In regular CAN transceiver operation, data transmitted into input 102 is received at receiver output 104, e.g., after a loop delay, as long as internal transceiver loop 930 is closed. Once an open condition is present on output data line 908 and/or 910, no data will be available at receiver output 104. Therefore, similar to the short detection scenario discussed above with reference to FIG. 6 and FIG. 7, a pulse detector (not shown in FIG. 9) may be used to detect pulses at receiver output 104 in order to determine the presence of a transmission failure, here, due to an open circuit condition.

Figure 10:
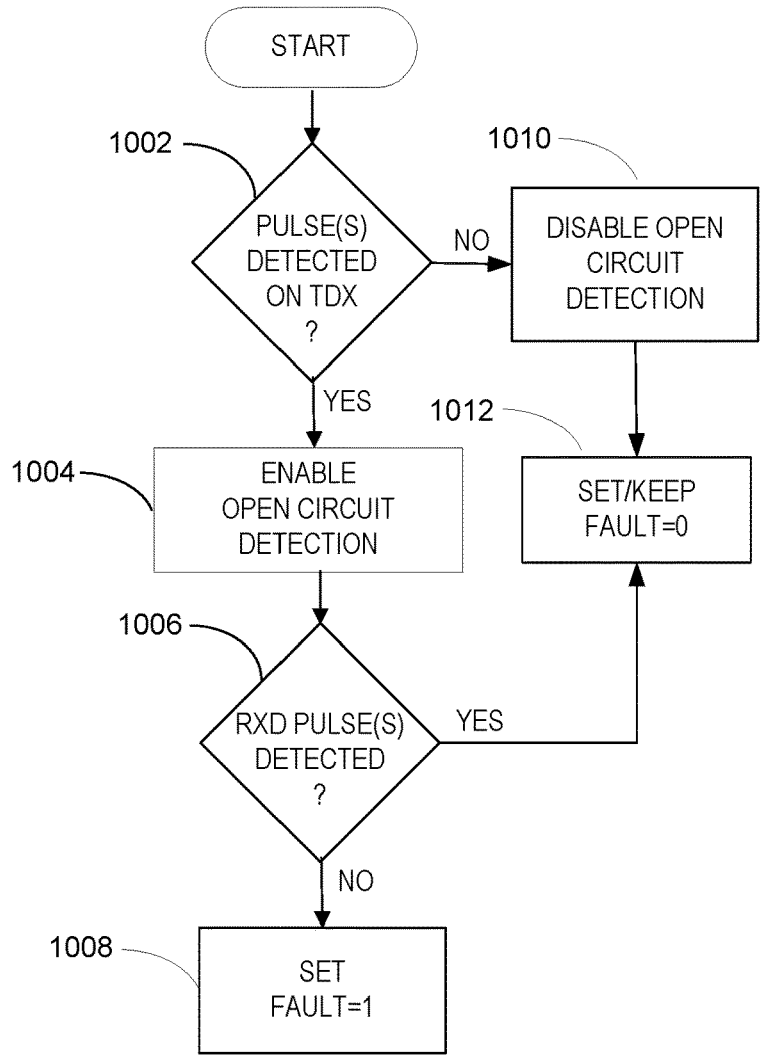
FIG. 10 is a flowchart that illustrates an exemplary process for enabling an open detection circuit according to various embodiments of the present disclosure.

FIG. 10 is a flowchart that illustrates an exemplary process for enabling an open detection circuit according to various embodiments of the present disclosure. In embodiments, once a pulse detector detects (1002) a number of pulses that may be received from a transceiver input, the pulse detector may enable (1004) the open circuit detection.

In embodiments, when a signal (e.g., set of predetermined pulses) is detected (1006) on a receiver output, a voltage at a fault pin may be set or allow to remain (1012) low, indicating the absence of a fault. Conversely, when no signal is detected on the receiver output, the voltage on the fault pin may be set high (1008) to indicate the presence of a fault.

As with the process for enabling a short detection circuit mentioned with reference to FIG. 7, in embodiments, if the pulse detector fails to detect a predetermined number of pulses, the open detection circuit may be not enabled or disabled (1010).

Figure 11:
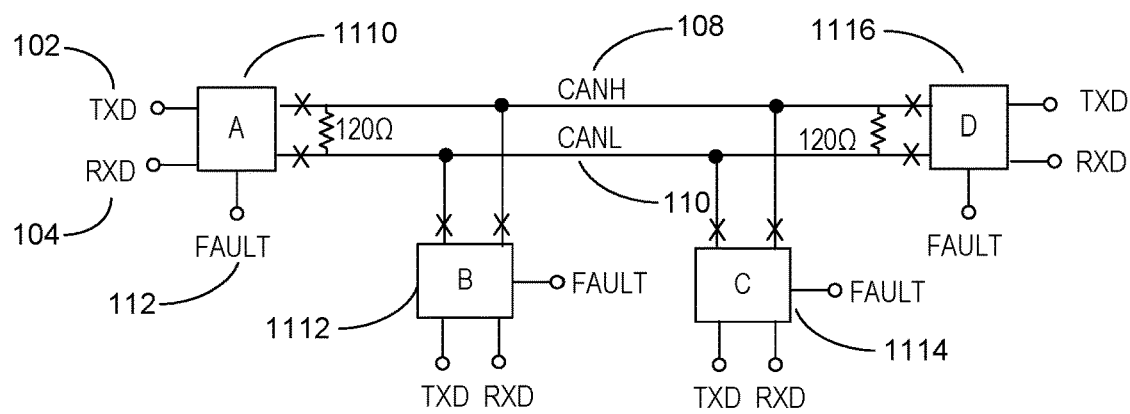
FIG. 11 illustrates troubleshooting of open and short fault conditions in an exemplary multi-node network according to various embodiments of the present disclosure.

FIG. 11 illustrates an exemplary multi-node network according to various embodiments of the present disclosure. Network 1100 comprises transceivers 1110-1116 that each may represent a node in network 1100. As depicted, transceivers 1110-1116 may be coupled to each other via output data lines 108, 110 and may comprise transceiver inputs (e.g., 102), transceiver outputs (e.g., 104), and fault pins (e.g., 112). In practice, transceivers 1110-1116 may be located relatively far away from each other, making the use of existing troubleshooting methods cumbersome.

As will be apparent to a person of skill in the art from reading the present disclosure, in embodiments, using the systems and/or methods presented allows users to debug various faults, such as open and short failure conditions also in multi-node network 1100. For example, in embodiments, the same test data may be provided to and shared by each transceiver 1110-1116. If an open or a short is present on any of transceivers 1110-1116, the respective fault pin (e.g., 112) will be high. By monitoring the fault data stored in one or more registers, the user may advantageously ascertain the type of fault and its location or, in other words, at which of transceivers 1110-1116 the detected fault has occurred.

It will be apparent to the person of skill in the art that, in embodiments, using transceiver input or output (e.g., 102) as a dual function pin that is also used for fault reporting significantly simplifies troubleshooting of common errors in transceiver circuits, such as multi-node transceiver network 1100. Advantageously, the dual function allows circuits to eliminate the need for independently generated clocks for reading the FDCs. In addition, the need for complex circuitry and methods for synchronization between the transceiver's input and an internal clock, for example, since transceiver input signals can comprise random data in certain cases, is also eliminated. Furthermore, false reporting, or even false detection, which otherwise may arise in inherently complex circuits, may also be eliminated.

It is understood that the analog circuits presented herein may utilize any known circuitry for converting analog outputs into some digital format suitable for processing by digital circuitry, e.g., the microcontroller previously mentioned. It is further understood that, in embodiments, circuits presented herein may be implemented using auxiliary components. For example, depending on a specific implementation, a fault that has been detected in the analog domain may be converted to a digital 0 or 1.

Aspects of the present invention may be encoded upon one or more non-transitory computer-readable media with instructions for one or more processors or processing units to cause steps to be performed. It shall be noted that the one or more non-transitory computer-readable media shall include volatile and non-volatile memory. It shall be noted that alternative implementations are possible, including a hardware implementation or a software/hardware implementation. Hardware-implemented functions may be realized using ASIC(s), programmable arrays, digital signal processing circuitry, or the like. Accordingly, the "means" terms in any claims are intended to cover both software and hardware implementations. Similarly, the term "computer-readable medium or media" as used herein includes software and/or hardware having a program of instructions embodied thereon, or a combination thereof. With these implementation alternatives in mind, it is to be understood that the figures and accompanying description provide the functional information one skilled in the art would require to write program code (i.e., software) and/or to fabricate circuits (i.e., hardware) to perform the processing required.

It shall be noted that embodiments of the present invention may further relate to computer products with a non-transitory, tangible computer-readable medium that have computer code thereon for performing various computer-implemented operations. The media and computer code may be those specially designed and constructed for the purposes of the present invention, or they may be of the kind known or available to those having skill in the relevant arts. Examples of tangible computer-readable media are magnetic media, such as hard disks, floppy disks, and magnetic tape; optical media such as CD-ROMs and holographic devices; magneto-optical media; and hardware devices that are specially configured to store or to store and execute program code, such as application specific integrated circuits (ASICs), programmable logic devices (PLDs), flash memory devices, and ROM and RAM devices. Examples of computer code include machine code, such as produced by a compiler, and files containing higher level code that are executed by a computer using an interpreter. Embodiments of the present invention may be implemented in whole or in part as machine-executable instructions that may be in program modules that are executed by a processing device. Examples of program modules include libraries, programs, routines, objects, components, and data structures. In distributed computing environments, program modules may be physically located in settings that are local, remote, or both.

One skilled in the art will recognize no computing system or programming language is critical to the practice of the present invention. One skilled in the art will also recognize that a number of the elements described above may be physically and/or functionally separated into sub-modules or combined.

It will be appreciated to those skilled in the art that the preceding examples and embodiments are exemplary and not limiting to the scope of the present disclosure. It is intended that all permutations, enhancements, equivalents, combinations, and improvements thereto that are apparent to those skilled in the art upon a reading of the specification and a study of the drawings are included within the true spirit and scope of the present disclosure. It shall also be noted that elements of any claims may be arranged differently including having multiple dependencies, configurations, and combinations.

What is claimed is:

1. A fault detection and reporting method comprising:
using a fault detection circuit to detect one or more fault conditions that cause a state change in a fault pin voltage that is representative of a transceiver failure;
in response to the state change, using a transceiver input to generate a fault detection code;
using the transceiver input as a clock signal to shift the fault detection code to a transceiver output, the transceiver output being configured to communicate the fault detection code to one or more external devices;
in response to the transceiver input receiving a first set of pulses, resetting the fault pin voltage to clear the fault detection code; and
in response to clearing the fault detection code, resuming with the step of using the fault detection circuit.

2. The fault detection and reporting method according to claim 1, further comprising initiating a fault detection cycle in the fault detection circuit.

3. The fault detection and reporting method according to claim 2, wherein initiating comprises transmitting a signal to the transceiver input.

4. The fault detection and reporting method according to claim 3, wherein the signal comprises a second set of pulses to enable fault detection.

5. The fault detection and reporting method according to claim 1, wherein the one or more fault conditions are detected on at least one output data line.

6. The fault detection and reporting method according to claim 1, wherein detecting one or more fault conditions comprises waiting for a time period between a first fault condition and a second fault condition.

7. The fault detection and reporting method according to claim 6, further comprising prioritizing one of the first fault condition and the second fault condition according to a priority order.

8. The fault detection and reporting method according to claim 7, further comprising using the priority order to prioritize a short circuit condition over at least one of a common mode rage violation and a transmission failure condition.

9. The fault detection and reporting method according to claim 1, wherein communicating the fault detection code comprises generating an alert.

10. The fault detection and reporting method according to claim 1, further comprising using the state change in the fault pin voltage to trigger an interrupt associated with a controller, the interrupt causing a transition from a regular mode of operation to a fault detection code generation mode of operation.

11. The fault detection and reporting method according to claim 1, wherein at least some part of the fault detection circuit is enabled in response to a pulse detector circuit detecting a dominant mode.

12. A fault detection and reporting circuit comprising:
an input that is communicatively coupled with a transceiver input signal, a fault pin, and a fault detection circuit, the fault detection circuit receives one or more fault conditions that cause a state change in a fault pin voltage representative of a transceiver failure, the transceiver input signal being used to generate, in response to the state change, a fault detection code; and
a transceiver clock generation circuit that is communicatively coupled with a transceiver output that communicates the fault detection code to one or more external devices, the transceiver clock generation circuit uses the transceiver input signal as a clock signal to shift the fault detection code to the transceiver output, the fault detection code being cleared in response to the fault pin voltage being reset.

13. The fault detection and reporting circuit according to claim 12, wherein the fault detection circuit comprises at least one of a short circuit detection circuit or an open circuit detection circuit.

14. The fault detection and reporting circuit according to claim 12, wherein the fault pin voltage is reset in response to the transceiver input signal comprising a set of pulses.

15. The fault detection and reporting circuit according to claim 12, further comprising a logic circuit that shifts the fault detection code to the transceiver output.

16. The fault detection and reporting circuit according to claim 12, further comprising one or more registers coupled to the transceiver output, the one or more registers hold the fault detection code.

17. The fault detection and reporting circuit according to claim 12, wherein the one or more fault conditions are detected on at least one output data line.

18. The fault detection and reporting circuit according to claim 12, wherein a second fault condition among the one or more fault conditions is detected after waiting for a time period after a first fault condition is detected according to a priority order.

19. The fault detection and reporting circuit according to claim 18, wherein the priority order is used to prioritize a short circuit condition over at least one of a common mode rage violation and a transmission failure condition.

20. The fault detection and reporting circuit according to claim 12, further comprising using the state change in the fault pin voltage to trigger an interrupt that interrupt causes a transition from a regular mode of operation to a fault detection code generation mode of operation.

* * * * *